United States Patent [19]

Pfeifer

[11] Patent Number: 4,898,806

[45] Date of Patent: Feb. 6, 1990

[54] COATED MATERIAL AND USE THEREOF

[75] Inventor: Josef Pfeifer, Therwil, Switzerland

[73] Assignee: Ciba-Geigy Corporation, Ardsley, N.Y.

[21] Appl. No.: 302,076

[22] Filed: Jan. 23, 1989

Related U.S. Application Data

[63] Continuation of Ser. No. 105,515, Oct. 2, 1987, abandoned, which is a continuation of Ser. No. 845,891, Mar. 28, 1986, abandoned.

[30] Foreign Application Priority Data

Apr. 11, 1985 [CH] Switzerland ............... 1551/85

[51] Int. Cl.$^4$ ................... G03C 5/16; B05D 3/06
[52] U.S. Cl. ..................... 430/325; 430/270; 430/330; 522/905; 522/904; 522/148; 522/164; 427/53.1; 427/54.1
[58] Field of Search ............ 430/270, 330, 325; 522/905, 904, 148, 164; 427/53.1, 54.1

[56] References Cited

U.S. PATENT DOCUMENTS

| | | | |
|---|---|---|---|
| 33,275,690 | 9/1966 | Stroh et al. | 260/576 |
| 3,435,002 | 3/1969 | Holub | 260/46.5 |
| 3,666,709 | 5/1972 | Suzuki et al. | 260/33.4 P |
| 3,702,318 | 11/1972 | Browning | 260/470 P |
| 3,787,367 | 1/1974 | Farrissey et al. | 260/65 |
| 3,855,273 | 12/1974 | Bilow | 260/471 R |
| 4,030,948 | 6/1977 | Berger | 148/33.3 |
| 4,146,723 | 3/1979 | Findeisen et al. | 548/307 |
| 4,242,437 | 12/1980 | Rohloff | 430/270 |
| 4,243,743 | 6/1981 | Hiramoto et al. | 430/330 |
| 4,331,705 | 5/1982 | Samudrala | 430/325 X |
| 4,395,527 | 7/1983 | Berger | 528/26 |
| 4,480,009 | 10/1984 | Berger | 428/447 |
| 4,499,149 | 2/1985 | Berger | 428/447 |

FOREIGN PATENT DOCUMENTS 132221 1/1985 European Pat. Off. .

OTHER PUBLICATIONS

D. K. Mohanty et al., Polymer Preprints 25, 19 (1984).
Grant, Julius, Ked, *Hackh's Chemical Dictionary*, 3rd ed., McGraw-Hill Book Company, Inc., New York, N.Y. 1944, pp. 62–63, 116, 347, 594, 641, 711, 712, 915.
*1982–1983 Aldrich Catalog/Handbook of Fine Chemicals*, Aldrich Chemical & Co., Milwaukee, Wisconsin, p. 130.

*Primary Examiner*—Michl Paul R.
*Assistant Examiner*—Cynthia Hamilton
*Attorney, Agent, or Firm*—Harry Falber

[57] ABSTRACT

A coated photosensitive material on a support comprising a layer of polyamic acids and polyamic acid aryl esters derived from tetracarboxylic acids or aminodicarboxylic acids containing a benzophenone structural unit and aromatic diamines which are substituted in both ortho-positions by at least one amino group. The material is autophotocrosslinkable and is suitable for producing protective coatings and photographic images, with corresponding polyimides being formed after irradiation by a thermal aftertreatment.

50 Claims, No Drawings

COATED MATERIAL AND USE THEREOF

This application is a continuation of application Ser. No. 105,515 filed Oct. 2, 1987, now abandoned, which is a continuation of application Ser. No. 845,891 filed 3/28/86, now abandoned.

The present invention relates to a material coated with a radiation-sensitive polyamic acid and/or polyamic acid ester and/or polyamic acid amine salt, and to the use thereof for the production of protective films or photographic relief images.

Polyimides are plastics with useful thermomechanical properties. Because of their high melting ranges, however, they cannot be processed by means of the shaping methods conventionally employed for thermoplastics. For this reason, soluble polyimides which may be used as varnishes for producing coating layers with high heat resistance have been developed (q.v. German Auslegeschrift No. 19 62 588 and U.S. Pat. No. 3 787 367). Advances in electronics and semiconductor technology have led to exacting requirements being made of polyimides as e.g. insulating and protective films. Soluble polyimides which can be crosslinked by irradiation are disclosed in European patent application EP-A-O 132 221. To improve the solubility of polyimides it is desirable to have available polyamic acids and esters which are also photopolymerisable.

Accordingly, the present invention relates to a coated material on a substrate, at least one surface of which substrate is coated with a layer of a polyamic acid, a polyamic acid aryl ester and/or a polyamic acid amine salt, or of a mixture thereof, which polymer contains 50 to 100 mol. %, based on said polymer, of at least one structural unit of formula I or II

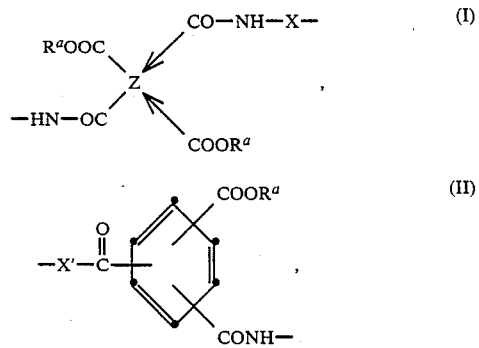

or of a mixture thereof, and 0 to 50 mol. % of a structural unit of formula III or IV

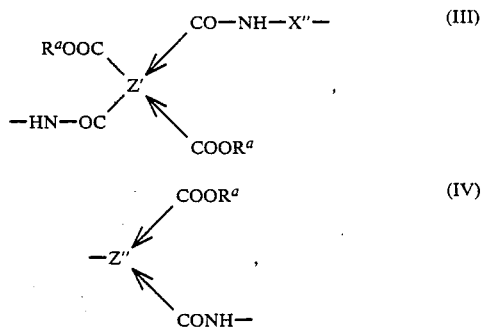

or of a mixture thereof, wherein the arrows denote position isomerism and $R^a$ is a hydrogen atom, aryl, tertiary ammonium containing at least one aliphatic or araliphatic hydrocarbon radical, or a mixture thereof, Z is a tetravalent aromatic radical which contains a benzophenone structural unit and to which one —CONH group and one —COOR$^a$ group is attached to one or two different phenyl radicals in ortho- or peri-position to each other, Z' is a tetravalent aromatic radical which differs from Z and to which one ester group and one amide group are attached in ortho- or peri-position to each other, Z'' is a trivalent aromatic radical which differs from the radical in the structural unit of formula II and to which one ester group and one amide group are attached in ortho- or peri-position to each other, X is the radical of an aromatic diamine which is substituted in both ortho-positions to at least one N-atom by alkyl, cycloalkyl, alkoxy, alkoxyalkyl or aralkyl, or two adjacent carbon atoms of the aromatic radical are substituted by alkylene, X' is a divalent aromatic radical which is substituted by at least one group as defined for X, and X'' has the same meaning as X or is a divalent radical of an organic diamine which differs from the radical X.

The polymer preferably contains 60–100 mol. %, most preferably 80–100 mol. %, of the structural units of formula I and/or II, and preferably 40 to 0 mol. %, most preferably 20 to 0 mol. %, of the structural units of formula II and/or IV. Further, less than 50 mol. % of the structural units of formulae I to IV may be replaced by corresponding esters containing an aliphatic group in the ester moiety. The aliphatic group is preferably $C_1$–$C_{12}$alkyl or benzyl.

$R^a$ as aryl contains preferably 6 to 12 carbon atoms and is preferably phenyl which may be substituted by $C_1$–$C_{12}$alkyl, $C_1$–$C_{12}$alkoxy, $C_1$–$C_{12}$alkylthio or halogen, in particular F, Cl or Br.

$R^a$ as tertiary ammonium contains preferably 3 to 20, most preferably 3 to 12, carbon atoms and has in particular the formula $NHR^sR^tR^u$, wherein $R^s$, $R^t$ and $R^u$ are each independently $C_1$–$C_{12}$alkyl, preferably $C_1$–$C_6$alkyl, $C_3$–$C_{12}$cycloalkyl, preferably $C_5$– or $C_6$cycloalkyl which may be substituted by $C_1$–$C_6$alkyl, or are $C_6$–$C_{12}$aryl which may be substituted by $C_1$–$C_6$alkyl or $C_1$–$C_6$alkoxy, or are $C_7$–$C_{16}$aralkyl which may be substituted by $C_1$–$C_6$alkyl or $C_1$–$C_6$alkoxy, with the proviso that at least one of $R^s$, $R^t$ or $R^u$ is alkyl, cycloalkyl or aralkyl. Aryl is preferably phenyl or substituted phenyl and aralkyl is benzyl or substituted benzyl.

Preferred emodiments are trialkylammonium, dialkylphenylammonium and dialkylbenzylammonium, the alkyl moieties of which contain 1 to 6 carbon atoms. Examples of $R^s$, $R^t$ and $R^u$ are methyl, ethyl, n-propyl, isopropyl, n-butyl, isobutyl and tert-butyl, pentyl, hexyl, octyl, cyclopentyl, methylcyclopentyl, cyclohexyl, methylcyclohexyl, phenyl, methylphenyl, dimethylphenyl, ethylphenyl, benzyl, phenethyl and methylbenzyl.

$R^a$ is preferably a hydrogen atom or tertiary ammonium containing at least one aliphatic or araliphatic hydrocarbon radical.

An aromatic radical X is preferably a divalent monocuclear or binuclear phenylene radical. The substitutents of X may contain, as linear or branched alkyl and alkoxy, 1 to 20, preferably 1 to 6 and, most preferably, 1 to 4, carbon atoms, as linear or branched alkoxyalkyl 2 to 12, preferably 2 to 6, carbon atoms, as alkylene 3 or 4 carbon atoms, as cycloalkyl 5 to 8, preferably 5 or 6, ring carbon atoms and, as aralkyl, 7 to 12 carbon atoms. Alkoxyalkyl is preferably alkoxymethyl and arylkyl is benzyl.

Examples of substituents are: methyl, ethyl, propyl, isopropyl, n-butyl, isobutyl, tert-butyl, pentyl, hexyl, octyl, dodecyl, tetradecyl, eicosyl, cyclopentyl, cyclohexyl, methylcyclohexyl, methoxy, ethoxy, propoxy, butoxy, pentoxy, hexoxy, methoxymethyl, methoxyäthyl, ethoxymethyl, propoxymethyl, butoxymethyl, benzyl, methylbenzyl and phenylethyl. The most preferred substituents are isopropyl, ethyl and, in particular, methyl.

A substituted aromatic radical X may contain 8 to 30, preferably 8 to 25, carbon atoms. The aromatic radical is preferably a pyridine radical and, most preferably, a hydrocarbon radical which is substituted by alkyl, alkoxyalkyl, alkoxy, trimethylene or tetramethylene. The aromatic radical may contain further substituents, e.g. a halogen such as Cl or Br. In a preferred subgroup, the mononuclear aromatic radicals are phenylene radicals and the binuclear radicals are naphthylene or bisphenylene radicals.

A preferred subgroup of polyamic acids and polyamic acid aryl esters suitable for use in this invention are those in which the aromatic radical X has the formula VIII, VIIIa and/or VIIIb

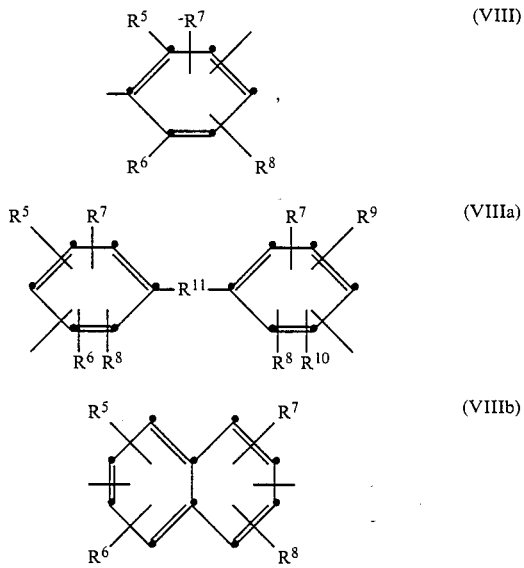

wherein the free bonds in formula VIII are meta or para to each other and in formula VIIIa are preferably meta or para to the $R^{11}$ group and $R^5$ and $R^6$ are located in both ortho-positions to the free bond, and in formula VIIIb the free bonds are in 2-, 3-, 6- and 7-position and $R^5$ and $R^6$ are located in both ortho-positions to the free bonds; $R^{11}$ is a direct bond, —O—, —S—, —SS—, —SO—, —SO$_2$—, —CO—, —COO—, —NH—, —N—alkyl containing 1 to 6 carbon atoms in the alkyl moiety,

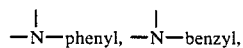

—CONH—, —CON—alkyl— containing 1 to 6 carbon atoms in the alkyl moiety, —CON—phenyl—, —CON—benzyl—,

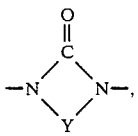

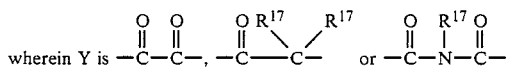

and $R^{17}$ is a hydrogen atom, $C_1$-$C_6$alkyl or phenyl, linear or branched alkylene of 1 to 3 carbon atoms, alkylidene of 2 to 12 carbon atoms which is unsubstituted or substituted by chloro or fluoro, cycloalkylidene containing 5 or 6 ring atoms, phenylene, phenylenedioxy, or the

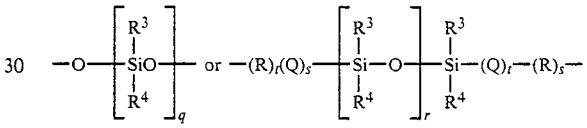

group, wherein $R^3$ and $R^4$ are alkyl or alkoxy, each of 1 to 6 carbon atoms, phenyl, benzyl, phenoxy or benzyloxy, r is an integer from 1 to 10, t is 0 or 1 and s is 0 or 1, R is —O— or —S— and Q is $C_1$-$C_6$alkylene, q is an integer from 1 to 100, $R^5$ and $R^6$ are alkyl or alkoxy, each of 1 to 12 carbon atoms, alkoxyalkyl of 2 to 12 carbon atoms, cyclopentyl, cyclohexyl or benzyl, or $R^5$ and $R^7$ in formula VIII or VIIIa are adjacent to each other and, when taken together, are trimethylene or tetramethylene, and $R^6$ may also be a hydrogen atom; $R^7$ and $R^8$ are a hydrogen atom or independently have the meaning of $R^5$ and $R^7$, and $R^9$ and $R^{10}$ are a hydrogen atom or independently have the meaning of $R^5$ and $R^6$; or $R^7$ and $R^9$ in formula VIIIa, when taken together, are trimethylene or tetramethylene. $R^5$ and $R^6$ are preferably $C_1$-$C_6$alkyl, in particular methyl, ethyl, n-propyl or isopropyl. The alkyl moiety of groups $R^{11}$ may be methyl, ethyl, propyl, isopropyl, n-butyl or pentyl. $R^{11}$ as alkylene is preferably ethylene and, most preferably, methylene. $R^{11}$ as alkylidene preferably contains 2 to 6 carbon atoms and is e.g. ethylidene, 2,2-butylidene, 2,2- or 3,3-pentylidene, hexafluoropropylidene and, preferably, 2,2-propylidene. $R^{11}$ as cycloalkylidene may be cyclopentylidene and, preferably, cyclohexylidene. The $R^{11}$ group is preferably a direct bond, —O—, —S—, —SO$_2$—, —CO—, alkylene or alkylidene. Most preferably $R^{11}$ is a direct bond, —O— and, in particular, —CO— or —CH$_2$—. $R^3$ and $R^4$ are preferably alkyl, most preferably methyl, or phenyl. R is preferably —O— and Q is preferably methylene or ethylene, q is preferably an integer from 1 to 10 and r is an integer from 1 to 20, preferably from 1 to 10. A further group of diamine radicals X comprises those of formula

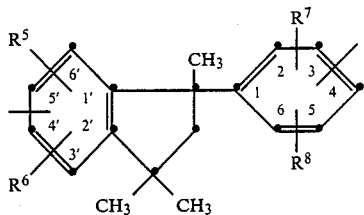

wherein the free bond is in the 4'- or 5'-position and the other is in position 3, 5 or, preferably 4, $R^5$ and $R^6$ and/or $R^7$ and $R^8$ are located ortho to the free bond and are alkyl or alkoxy, each of 1 to 12 carbon atoms, or alkoxyalkyl of 2 to 12 carbons.

A particularly preferred subgroup of structural units is that in which X in formula I is a radical of formula

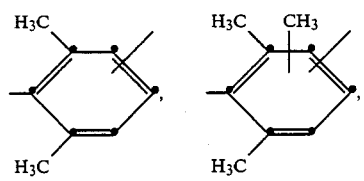

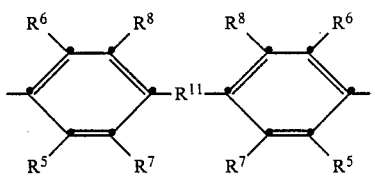

wherein the free bonds are meta or para to each other; or is a radical of formula

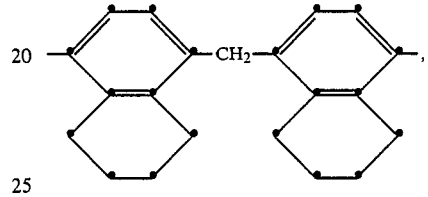

wherein $R^5$ and $R^6$ are each independently methyl, ethyl, n-propyl or isopropyl, and $R^7$ and $R^8$ are a hydrogen atom or have the meaning of $R^5$, or $R^5$ and $R^7$, when taken together, are trimethylene or tetramethylene and $R^6$ and $R^7$ are a hydrogen atom, and $R^{11}$ is a direct bond, —$CH_2$—, 2,2-propylidene or —CO—. Among these divalent radicals, those radicals are preferred in which $R^5$, $R^6$, $R^7$ and $R^8$ are methyl. A coated material which contains at least 2 different radicals of these formulae as structural units of formula I constitutes a further preferred embodiment of this invention.

Copolyamic acids, aryl esters and tert-ammonium salts thereof which may suitably be used in this invention contain at least two different structural units, the number of different structural units essentially depending on the desired properties and the field of use. Preferably they will contain 2 to 4 different structural units, which units may differ only in the radical X in formula I. In a particularly preferred embodiment, the copolyamic acids, aryl esters and tert-ammonium salts thereof contain stuctural units of ortho-disubstituted phenylenes, in particular of 1,3-phenylenes, and/or of ortho-substituted diphenylenes which may contain a bridge.

Representative examples of X are: 2,6-dimethyl-1,4- or 1,3-phenylene, 2,6-diethyl-1,4- or 1,3-phenylene, 2,6-dimethyl-5-chloro-1,4- or 1,3-phenylene, 2-methyl-6-ethyl-1,4- or 1,3-phenylene, 2-methyl-6-isopropyl-1,4- or 1,3-phenylene, 2,6-diisopropyl-1,4- or 1,3-phenylene, 2,6-dimethoxy-1,4- or 1,3-phenylene, 2,6-diethoxy-1,4- or 1,3-phenylene, 2-methyl-6-methoxy-1,4- or 1,3-phenylene, 2,6-dibenzyl-1,4- or 1,3-phenylene, 2,6-dimethoxymethyl-1,4- or 1,3-phenylene, 2,5,6-trimethyl-1,4- or 1,3-phenylene, 2,5,6-triethyl-1,4- or 1,3-phenylene, 2,4,6-trimethyl-1,3-phenylene, 2,3,5,6-tetramethyl-1,4-phenylene, 2,4,5,6-tetramethyl-1,3-phenylene, tetrahydro-1,4- or 1,3-naphthylene, radicals of the formulae

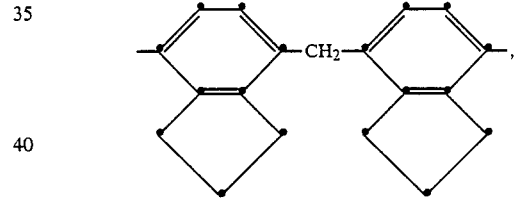

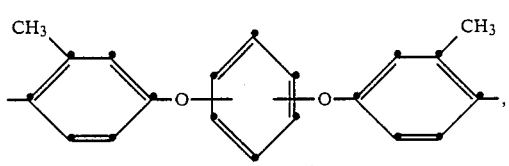

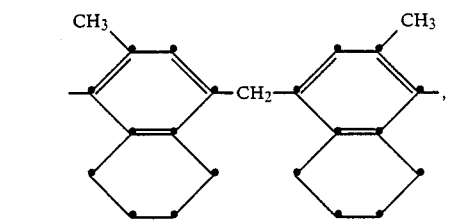

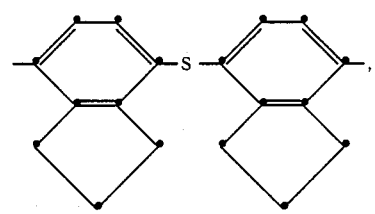

-continued

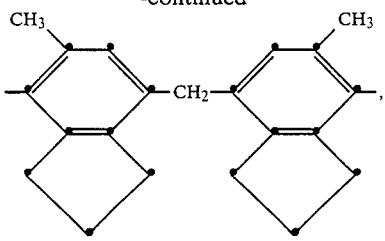

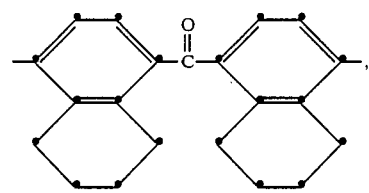

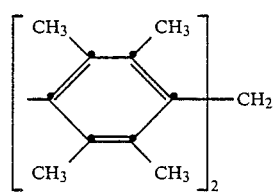

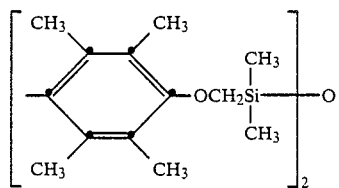

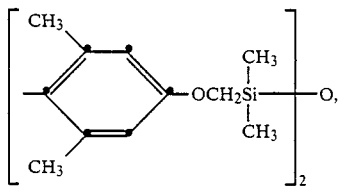

as well as

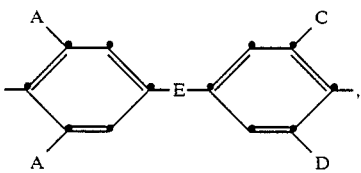

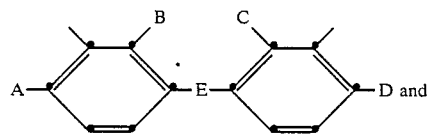

wherein A, B, C, D and E are as defined in the following Table. The free positions in the phenyl nuclei of the last three formulae may be taken by one or two further substituents G or H in each nucleus, in which case G and H may have the meanings of A or B in the Table.

| E | A | B | C | D |
|---|---|---|---|---|
| CH₂ | methyl | methyl | H | H |
| CH₂ | methyl | ethyl | H | H |
| CH₂ | ethyl | ethyl | H | H |
| CH₂ | isopropyl | isopropyl | H | H |
| CH₂ | methoxymethyl | | H | H |
| CH₂ | benzyl | benzyl | H | H |
| CH₂ | methyl | methyl | methyl | H |
| CH₂ | ethyl | ethyl | ethyl | H |
| CH₂ | isopropyl | isopropyl | methyl | methyl |
| CH₂ | methoxymethyl | | methyl | H |
| CH₂ | methyl | methyl | methyl | H |
| CH₂ | methoxymethyl | | methoxymethyl | |
| CH₂ | methyl | methyl | methyl | methyl |
| CH₂ | ethyl | ethyl | ethyl | ethyl |
| CH₂ | methyl | methyl | ethyl | ethyl |
| CH₂ | ethyl | ethyl | isopropyl | isopropyl |
| CH₂ | isopropyl | isopropyl | isopropyl | isopropyl |
| CH₂ | isopropyl | isopropyl | methyl | H |
| CH₂ | methoxy | methoxy | methyl | methyl |
| O | methyl | methyl | H | H |
| O | ethyl | ethyl | H | H |
| O | methyl | methyl | methyl | H |
| O | methyl | methyl | methyl | methyl |
| O | methyl | methyl | ethyl | ethyl |
| S | methyl | methyl | H | H |
| S | ethyl | ethyl | H | H |
| S | methyl | methyl | H | H |
| S | methyl | methyl | methyl | methyl |
| S | ethyl | ethyl | ethyl | ethyl |
| S | methyl | methyl | ethyl | ethyl |
| CO | methyl | methyl | methyl | H |
| CO | methyl | methyl | H | H |
| CO | methyl | methyl | methyl | methyl |
| SO₂ | methyl | methyl | ethyl | H |
| SO₂ | methyl | methyl | H | H |
| SO₂ | methyl | methyl | methyl | methyl |
| SO₂ | ethyl | ethyl | methyl | methyl |
| SO | methyl | methyl | methyl | methyl |
| SO | methyl | methyl | H | H |
| COO | methyl | methyl | H | H |
| COO | methyl | methyl | methyl | methyl |
| CONCH₃ | Methyl | Methyl | H | H |
| NCH₃ | methyl | methyl | ethyl | ethyl |
| NCH₃ | methyl | methyl | methyl | methyl |
| CONH | methyl | methyl | — | — |
| NH | ethyl | methyl | ethyl | methyl |
| NH | methyl | methyl | methyl | methyl |
| Si(methyl)₂ | methyl | methyl | H | H |
| Si(phenyl)₂ | methyl | methyl | methyl | methyl |
| Si(Omethyl)₂ | ethyl | ethyl | H | H |
| Si(Ophenyl)₂ | methyl | methyl | methyl | methyl |
| —OSi(methyl)₂O— | methyl | methyl | methyl | methyl |
| ethylene | methyl | methyl | H | H |
| ethylene | methyl | methyl | methyl | methyl |
| ethylene | ethyl | ethyl | H | H |
| ethylene | methyl | methyl | ethyl | ethyl |
| ehenylene | methyl | methyl | methyl | methyl |
| phenylene | ethyl | ethyl | H | H |
| 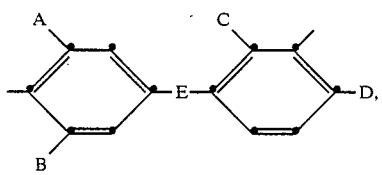 (CH₃)₂C | methyl | ethyl | methyl | ethyl |
| (CH₃)₂C | methyl | methyl | methyl | methyl |
| (CF₃)₂C | methyl | methyl | methyl | methyl |
| direct bond | methyl | methyl | H | H |

| E | A | B | C | D |
|---|---|---|---|---|
| direct bond | methyl | ethyl | methyl | ethyl |
| direct bond | methyl | ethyl | methyl | H |
| direct bond | ethyl | ethyl | ethyl | ethyl |
| direct bond | methoxy | methoxy | methoxy | methoxy |
| direct bond | isopropyl | isopropyl | H | H |
| direct bond | methoxy-methyl | methoxy-methyl | methoxy-methyl | methoxy-methyl |

The diamines from which X is derived are known or can be obtained by known processes. Silicone-containing diamines are disclosed in U.S. Pat. No. 3 435 002 and European patent application EP-A-O 054 426. Diamines containing the

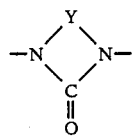

group can be prepared from the diisocyanates disclosed in German Offenlegungsschrift No. 2 318 170. Alkyl- or cycloalkyl-substituted diamines, in particular ethyl- or propyl-substituted diamines, can be obtained by alkylating unsubstituted or partially substituted aromatic diamines with alkenes or cycloalkenes (q.v. U.S. Pat. No. 3 275 690). Polynuclear, in particular binuclear, aromatic diamines can be obtained by condensing appropriate monoamines with aldehydes or ketones.

X" in the structural unit of formula III may be linear or branched $C_7$-$C_{30}$alkylene, cycloalkylene containing 5 to 8 ring carbon atoms, $C_7$-$C_{30}$aralkylene, $C_6$-$C_{22}$arylene and/or a polysiloxane radical.

A divalent aliphatic radical X" in formula III preferably contains 6 to 30 and, most preferably, 6 to 20, carbon atoms. In a preferred sub-group, X" is linear or branched alkylene which may be interrupted by oxygen atoms, $NR^o$, $\oplus NR_2^o G^\ominus$, cyclopentylene, cyclohexylene, naphthylene, phenylene or hydantoin radicals. $R^o$ may be for example alkyl of 1 to 12 carbon atoms, cycloalkyl of 5 or 6 ring carbon atoms, phenyl or benzyl. $G^\ominus$ is an anion of a protic acid, for example halide, sulfate or phosphate. In a preferred embodiment, X" is linear or branched $C_6$-$C_{30}$alkylene, $-(CH_2)_x-R^{13}-(CH_2)_y-$, wherein $R^{13}$ is phenylene, naphthylene, cyclopentylene or cyclohexylene and m and n are each independently of the other 1, 2 or 3, $-R^{14}-(OR^{15})_pO-R^{14}-$, in which $R^{14}$ is ethylene, 1,2-propylene, 1,3-propylene or 2-methyl-1,3-propylene, $R^{15}$ is ethylene, 1,2-propylene, 1,2-butylene, 1,3-propylene or 1,4-butylene and p is an integer from 1 to 100, or

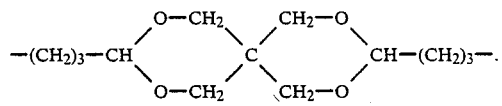

Examples of aliphatic radicals are: methylene, ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes, eicosylenes, 2,4,4-trimethylhexylene, 1,10-dialkyldecylene, in which the alkyl preferably contains 1 to 6 carbon atoms, substituted 1,11-undecylenes, for example those described in European patent application B-O 011 559, radicals of jeffamines, for example

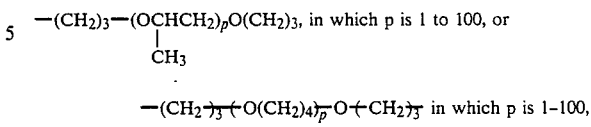

$-(CH_2)_3-(OCHCH_2)_pO(CH_2)_3-$, in which p is 1 to 100, or
      |
      $CH_3$ $-(CH_2)_3-(O(CH_2)_4)_p-O-(CH_2)_3-$ in which p is 1–100, dimethylenecyclohexane, xylylene and diethylenebenzene.

Aliphatic radicals interrupted by heterocyclic radicals may be e.g. those derived from N,N'-aminoalkylated hydantoins or benzimidazoles. Examples are N,N'-(γ-aminopropyl)-5,5-dimethylhydantoin or N,N'-(γ-aminopropyl)-benzimidazolones, and those of the formula

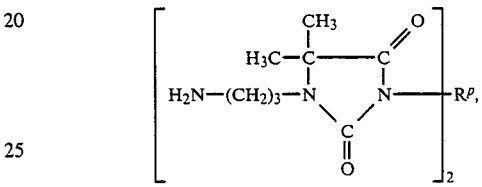

in which $R^p$ is alkylene of 1 to 12, preferably 1 to 4, carbon atoms or

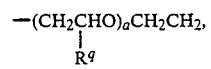

$-(CH_2CHO)_aCH_2CH_2$,
       |
       $R^q$ in which $R^o$ is a hydrogen atom or methyl and a is an integer from 1 to 20.

Examples of suitable substituents of the aliphatic radicals are halogens such as F or Cl, and alkoxy of 1 to 6 carbon atoms.

A divalent cycloaliphatic radical X" in formula III preferably contains 5 to 8 ring carbon atoms and is, in particular, mononuclear or binuclear cycloalkylene which has 5 to 7 ring carbon atoms and is preferably unsubstituted or substituted by alkyl which preferably contains 1 to 4 carbon atoms. In a preferred embodiment, a cycloaliphatic radical X" is a radical of the formula

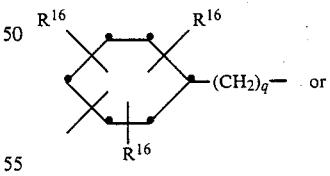

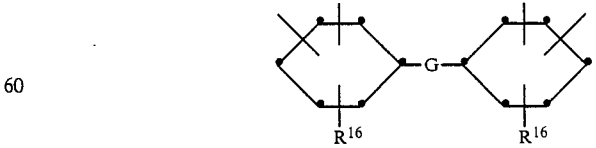

wherein q is 0 or 1, each $R^{16}$ is independently hydrogen or alkyl of 1 to 6 carbon atoms and G is a direct bond, O, S, $SO_2$, alkylene of 1 to 3 carbon atoms or alkylidene of 2 to 6 carbon atoms. $R^{16}$ is preferably ethyl or methyl, G is preferably methylene and the alkylidene radical preferably contains 2 or 3 carbon atoms and is, for example, ethylidene or 1,1- or 2,2-propylidene.

Examples of a cycloalkylene radical X″ are typically: 1,2- or 1,3-cyclopentylene, 1,2-, 1,3- or 1,4-cyclohexylene, cycloheptylene, cyclooctylene, methylcyclopentylene, methyl- or dimethylcyclohexylene, 3- or 4-methylcyclohex-1-yl, 5-methyl-3-methylenecyclohex-1-yl, 3,3′- or 4,4′-biscyclohexylene, 3,3′-dimethyl-4,4′-biscyclohexylene, 4,4′-biscyclohexylene ether, 4,4′-biscyclohexylenesulfone, 4,4′-biscyclohexylene-methane or 4,4′-biscyclohexylene-2,2-propane, as well as the divalent radicals of bisaminomethyltricyclodecane, bisaminomethylnorborane and menthanediamine.

A particularly preferred divalent cycloaliphatic radical X″ is 1,4-or 1,3-cyclohexylene, 2,2,6-trimethyl-6-methylene-cyclohex-4-yl, methylenebis(cyclohex-4-yl) or methylenebis(3-methylcyclohex-4-yl).

An araliphatic radical X″ preferably contains 7 to 30 carbon atoms. The aromatic groups are preferably substituted in the same manner as an aromatic radical X′, including the preferred substitutions, but is at least mono-substituted, preferably in the ortho-position to the N-atom. The araliphatic radical preferably contains 8 to 26 carbon atoms. The aromatic radical in the araliphatic radical is preferably a phenyl radical. An araliphatic radical X″ is, in particular, aralkylene which is unsubstituted or substituted by alkyl in the aryl moiety, the alkylene radical being linear or branched. In a preferred embodiment, the araliphatic radical has the formula

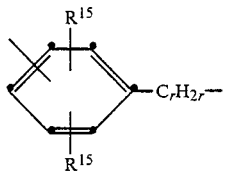

wherein each $R^{15}$ independently is a hydrogen atom or preferably $C_1$–$C_6$ alkyl, and r is an integer from 1 to 20. The free bond can be ortho, meta or preferably para to the $C_rH_{2r}$ group and one $R^{15}$ or each $R^{15}$ is preferably located para to the free bond.

Examples of an araliphatic radical X″ are typically: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylene-propylene, 3-methyl-p-phenylene-propylene, p-phenylenebutylene, 3-ethyl-p-phenylenepentylene and, in particular, longerchain phenylenealkylene radicals of diamines, which are described e.g. in European patent application A-O 069 062: 6-(p-phenylene)-6-methyl-hept-2-yl, 6-(3′-methyl-p-phenylene)-6-methylhept-2-yl, 6-(3′-ethyl-p-phenylene)-6-methylhept-2-yl, 6-(3′,5′-dimethyl-p-phenylene)-6-methylhept-2-yl, 11-(p-phenylene)-2,11-dimethyl-dodec-1-yl and 13-(p-phenylene)-2,12-dimethyltetradec-3-yl.

X″ as arylene preferably contains 6 to 22 carbon atoms. The arylene radical is preferably a mononuclear or binuclear phenylene radical. The arylene radical may be substituted, e.g. by $C_1$–$C_6$alkyl or $C_1$–$C_6$alkoxy, $C_2$–$C_6$alkoxymethyl and/or halogen such as fluoro or chloro.

1,3-Phenylenes which are substituted in one ortho-position to the free bond by $C_1$–$C_4$alkyl, preferably methyl, are preferred.

In one embodiment, X″ has the formula IX

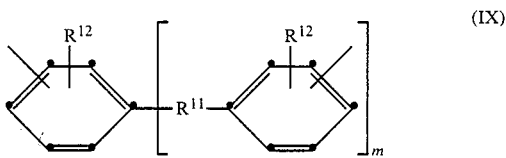

wherein m is 0 or 1, the free bonds are meta and preferably ortho to the $R^{12}$ group, $R^{11}$ has the same meaning as in formula VIIIa and $R^{12}$ has the same meaning as $R^5$.

A preferred subgroup of arylene radicals comprises those of formula IXa, IXb or IXc

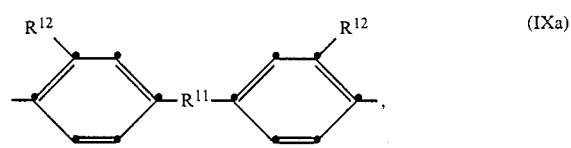

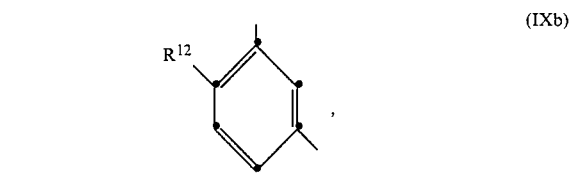

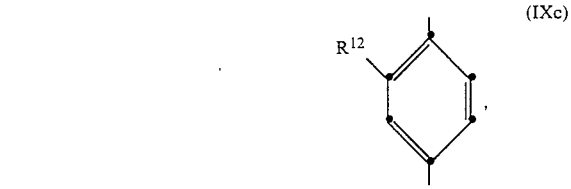

wherein $R^{11}$ is a direct bond, —O—, —CO— or —CH$_2$—, and $R^{12}$ is methyl, ethyl, isopropyl, methoxy, ethoxy or a hydrogen atom.

Examples of diamines H$_2$N-X″-NH$_2$ containing an aromatic radical are: 4,4′-methylenebis-(o-chloroaniline), 3,3′-dichlorobenzidine, 3,3′-sulfonyldianiline, 4,4′-diaminobenzophenone, 1,5-diaminonaphthalene, bis(4-aminophenyl)dimethylsilane, bis(4-aminophenyl)-diethylsilane, bis(4-aminophenyl)diphenylsilane, bis(4-aminophenyloxy)dimethylsilane, bis(4-aminophenyl)ethylphosophine oxide, N-[bis(4-aminophenyl)]-N-methylamine, N-[bis-(4-aminophenyl)]-N-phenylamine, 4,4′-methylenebis(3-methylaniline), 4,4′-methylenebis(2-ethylaniline), 4,4′-methylenebis(2-methoxyaniline), 5,5′-methylenebis(2-aminophenol), 4,4′-methylenebis-(2-methylanilin), 4,4′-oxybis(2-methoxyaniline), 4,4′-oxybis)2-chloroaniline), 5,5′-oxybis(2-aminophenol), 4,4′-thiobis-(2-methylaniline), 4,4′-thiobis(2-methoxyaniline), 4,4′-thiobis-(2-chloroaniline), 4,4′-sulfonylbis(2-methylaniline), 4,4′-sulfonylbis(2-ethoxyaniline), 4,4′-sulfonylbis(2-chloraniline), 5,5′-sulfonylbis(2-aminophenol), 3,3′-dimethyl-4,4′-diaminobenzophenone, 3,3′-dimethoxy-4,4′-diaminobenzophenone, 3,3′-dichloro-4,4′-diaminobenzophenone, 4,4′-diaminobiphenyl, m-phenylenediamine, p-phenylenediamine, 4,4′-methylenedianiline, 4,4′-oxydianiline, 4,4′-thiodianiline, 4,4′-sulfonyldianiline, 4,4′-isopropylidenedianiline, 3,3′-dimethylbenzidine, 3,3′-dimethoxybenzidine, 3,3′-dicarboxybenzidine, diaminotoluene, 4,4′-methylenebis(3-carboxyaniline) and the esters thereof, 5-amino-1-(4-aminophenyl)-1,3,3-trimethylindane.

X" may also be a divalent radical which contains siloxane groups and may have the formula

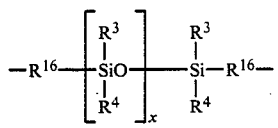

wherein x is a rational number of at least 1, $R^3$ and $R^4$ are as previously defined and $R^{16}$ is a divalent hydrocarbon radical, e.g. alkylene of 1 to 12, preferably of 1 to 6, carbon atoms, cycloalkylene containing preferably 5 or 6 ring carbon atoms, or is phenylene. $R^3$ and $R^4$ are preferably methyl or phenyl and x is preferably an integer from 1 to 1000, in particular from 1 to 100 and, most preferably, from 1 to 10. Alkylene is typically ethylene, 1,3- or 1,2-propylene, 1,3- or 1,4-butylene. Diamines containing this group X" are disclosed in U.S. Pat. No. 4 030 948. Further suitable diamines containing a group X" that contains siloxane groups are disclosed in U.S. Pat. No. 3 435 002 and European patent application EP-A-0 054 426.

Tetravalent aromatic radicals Z and Z' and a trivalent radical Z'" contain preferably 6 to 30, most preferably 6 to 20, carbon atoms. In a preferred subgroup, Z' has the formula

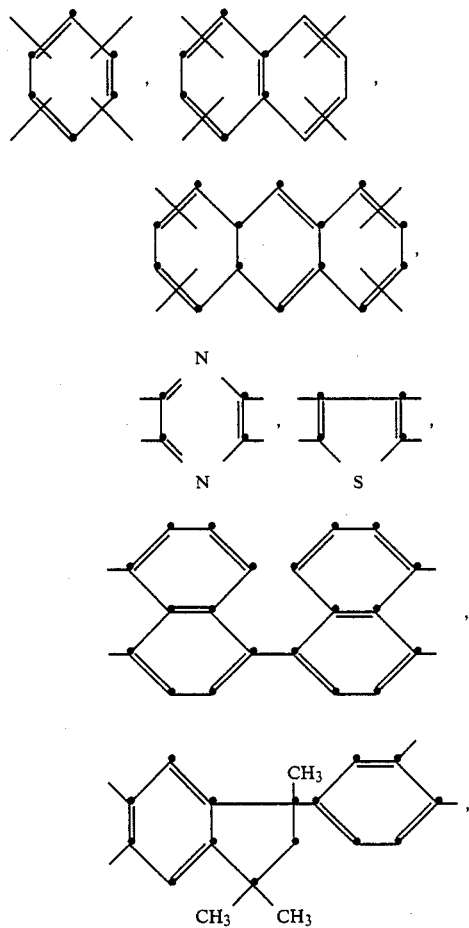

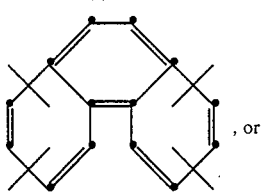, or

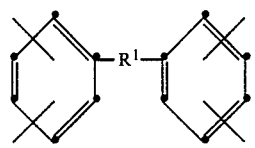

wherein $R^1$ is a direct bond or a bridge of the formula

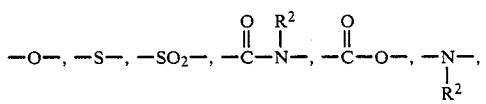

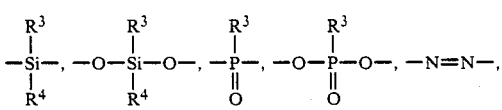

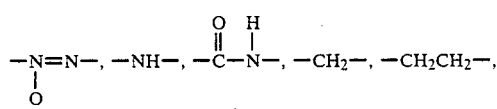

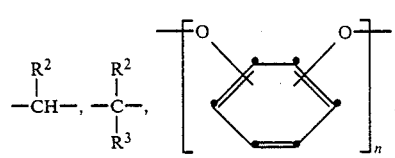

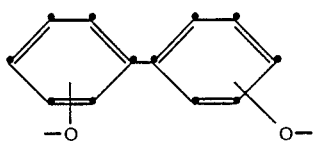

wherein $R^2$, $R^3$ and $R^4$ are $C_1$-$C_6$alkyl, phenyl or benzyl, and $R^3$ and $R^4$ in the silicne-containing groups are $C_1$-$C_6$alkoxy, phenoxy or benzyloxy.

In the above formulae, a pair of free bonds is always in peri-and/or ortho-position.

A preferred subgroup for Z' comprises radicals of the formulae

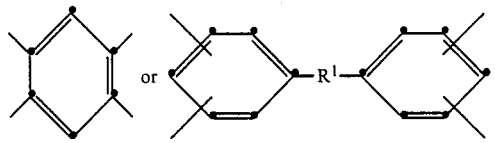

wherein $R^1$ is a direct bond, —O—, —$SO_2$— or —$CH_2$—.

Most preferably, Z' is a radical of the formula

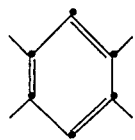

Representative examples of tetracarboxylic anhydrides containing a radical Z' are:
2,3,9,10-perylenetetracarboxylic dianhydride,
1,4,5,8-naphthalenetetracarboxylic dianhydride,
2,6-dichloronaphthalene-1,4,5,8-tetracarboxylic dianhydride,
2,7-dichloronaphthalene-1,4,5,8-tetracarboxylic dianhydride,
2,3,6,7-tetrachloronaphthalene-1,4,5,8-tetracarboxylic dianhydride,
phenanthrene-1,8,9,10-tetracarboxylic dianhydride,
pyromellitic dianhydride,
3,3'4,4'-biphenyltetracarboxylic dianhydride,
2,2',3,3'-biphenyltetracarboxylic dianhydride,
4,4'-isopropylidenediphthalic dianhydride,
3,3'-isopropylidenediphthalic dianhydride,
4,4'-oxydiphthalic anhydride,
4,4'-sulfonyldiphthalic anhydride,
3,3'-oxydiphthalic anhydride,
4,4'-methylenediphthalic anhydride,
4,4'-thiodiphthalic anhydride,
4,4'-ethylidenediphthalic anhydride,
2,3,6,7-naphthalenetetracarboxylic dianhydride,
1,2,4,5,-naphthalenetetracarboxylic dianhydride,
1,2,5,6-naphthalenetetracarboxylic dianhydride,
benzene-1,2,3,4-tetracarboxylic dianhydride,
thiophene-2,3,4,5-tetracarboxylic dianhydride,
1-(3',4'-dicarboxyphenyl)-1,3,3-trimethylindane-5,6-dicarboxylic dianhydride,
1-(3',4'-dicarboxyphenyl)-1,3,3-trimethylindane-6,7-dicarboxylic dianhydride,
1-(3',4'-dicarboxyphenyl)-3-methylindane-5,6-dicarboxylic dianhydride,
1-(3',4'-dicarboxyphenyl)-3-methylindane-6,7-dicarboxylic dianhydride.

Z in formula I has the formula V, VI, VII or VIII

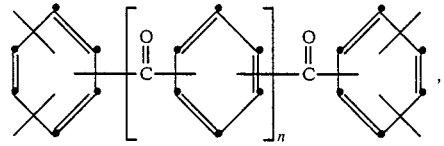 (V)

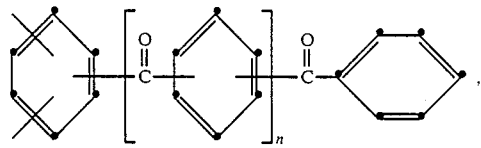 (VI)

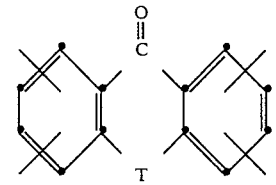 (VII)

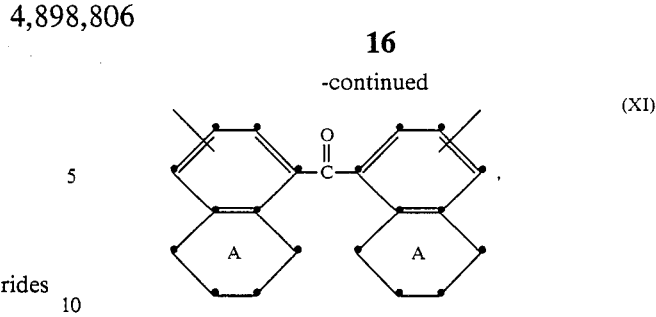 (XI)

wherein n is 0 or 1, T is a direct bond, —CH$_2$—, —O—, —S—, —SO—, —SO$_2$—, —CO—, NR$^b$ or —CR$^b$R$^c$, where R$^b$ is a hydrogen atom, C$_1$–C$_{10}$alkyl, naphthyl or benzyl, and R$^c$ has the significance of R$^b$ but is not hydrogen, the rings A in formula XI are saturated or aromatic and a pair of free bonds is ortho to each other.

In formulae V and VI, n is preferably O. T in formula VII is preferably —O— or —CO—.

Z''' is preferably a trivalent phenyl, naphthyl or biphenylene radical. Preferably Z''' has the formula

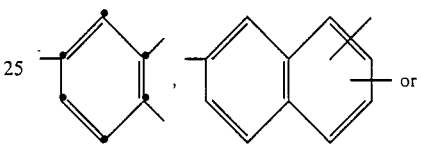

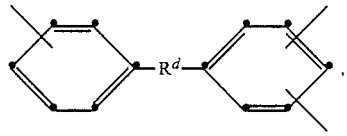

wherein R$^d$ is a bridge or a direct bond and two free bonds are ortho to each other. A bridge R$^d$ is preferably —O—, —S—, —CO— and —CH$_2$—, as well as alkylidene of 2 to 6 carbon atoms, cyclopentylidene and cyclohexylidene.

The aromatic radical X' in formula II is substituted by alkyl or aralkyl in at least one ortho-position, but preferably in both ortho-positions, to the free bond. The preferred aralkyl substituent is benzyl. The alkyl substituent contains preferably 1 to 12, most preferably 1 to 4, carbon atoms, and may be linear or branched. Particularly preferred alkyl substituents are methyl, ethyl and isopropyl. Further examples are n-propyl, n-butyl, isobutyl, pentyl, hexyl, octyl, decyl and dodecyl.

The aromatic radical X' is preferably an alkyl-substituted phenylene radical or bisphenylene radical. Preferably the radical X' has the formula X

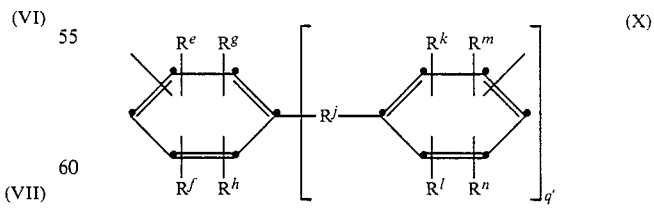 (X)

wherein q' is 0 or 1, R$^j$ is a direct bond or a bridge, R$^e$ is C$_1$–C$_4$alkyl and R$^f$ to R$^n$ is a hydrogen atom or C$_1$–C$_4$alkyl, and the free bonds are meta or para to the R$^j$ group.

In one embodiment, R$^e$ and R$^f$ as well as R$^m$ and R$^n$ are ortho to the free bond and are C$_1$–C$_4$alkyl. In a particuarly preferred embodiment, q' in formula II is O and $R^e$ to $R^h$ are $C_1$–$C_4$alkyl, preferably methyl or ethyl.

The bridge $R^j$ may have the same meaning as $R^{11}$. Preferably $R^j$ is a direct bond, —S—, —O—, —SO—, —SO$_2$—, —CO—CH$_2$— or $C_2$–$C_6$alkylidene, e.g. ethylidene, 1,1- or 2,2-propylidene, butylidene, cyclopentylidene and cyclohexylidene.

In a preferred embodiment, the radical of formula II corresponds to the structural unit of the formula

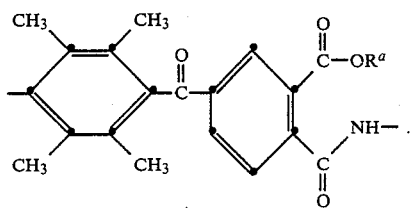

The polyamic acids, aryl esters and tert-ammonium salts thereof have average molecular weights ($\overline{M}w$) of preferably not less than 2000, most preferably of not less than 5000. The upper limit depends essentially on the desired properties such as ease of processing or solubility, and can be up to 500,000, preferably up to 100,000 and, most preferably, up to 50,000. The copolymers can furthermore be random polymers or block polymers. They are prepared by conventional methods in apparatus envisaged for the purpose.

The aminodicarboxylic acids containing structural units of formula II can be obtained e.g. in the following manner:

Trimellitic n-butylimide is converted with SOCl$_2$ into

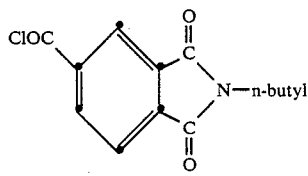

which is reacted, in the presence of AlCl$_3$, with H'X to give

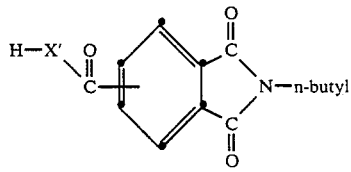

This compound is nitrated with NHO$_3$ and the resultant nitro compound is catalytically hydrogenated to the amino compound

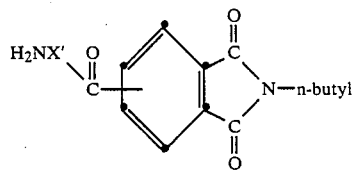

The imide can be converted in known manner into its acid derivatives.

4,4'-Ketobis(naphthalene-1,2-dicarboxcylic acid) can be obtained by reaction of 2 moles of 1,2-dimethylnaphthalene with COCl$_2$, in the presence of AlCl$_3$, and subsequent oxidation of the resultant 4,4'-ketobis(1,2-dimethylnaphthalene) with HNO$_3$ to give the tetracarboxylic acid. This tetracarboxylic acid can be partially hydrogenated to the 4,4'-keto(tetrahydronaphthalene-1,2-dicarboxylic acid). The hydrogenation can also be carried out before the oxidation with 4,4'-ketobis(1,2-dimethylnaphthalene).

Some tetracarboxylic acids containing structural units of formula VII are known.

Anthraquinonetetracarboxylic acids are described e.g. in U.S. Pat. No. 3 702 318 and CA 100,1006119a (1984).

Hydrogenation of the keto groups in anthraquinonetetracarboxylic acids with e.g. NaBH$_4$ gives the corresponding dihydroxy compound, which can be converted into anthronetetracarboxylic acid by treatment with hydrochloric acid under reflux. The CH$_2$ group of the anthronetetracarboxylic acid can be alkylated in known manner and thus converted into the CHR$^b$ or CR$^b$R$^c$ group.

Fluorenonetetracarboxylic acid can be prepared e.g. by dimerising 3,4-dimethylmagnesium bromide in the presence of CuCl$_2$ and reacting the resultant 3,3',4,4'-tetramethylbiphenyl with COCl$_2$, in the presence of AlCl$_3$, to the tetramethylfluorenone, which can be oxidised in known manner with e.g. NHO$_3$ to the tetracarboxylic acid.

Xanthonetetracarboxylic acid is obtained by first reacting 3,3',4,4'-tetramethylphenyl ether with CCl$_4$, in the presence of AlCl$_3$, and subsequently hydrolysing the reaction product with dilute HCl to 2,3,6,7-tetramethylxanthone, which is oxidised in known manner with e.g. HNO$_3$ to the tetracarboxylic acid.

Tetracarboxylic acids containing structural units of formula VII, wherein T is S, SO$_2$ or NR$^b$, can be obtained in the following manner: 1-bromo-3,4-dimethylbenzene is reacted with CCl$_4$, in the presence of AlCl$_3$, to bis(2-bromo-3,4-dimethylphenyl)dichloromethane. Oxidation with 20% NHO$_3$ gives

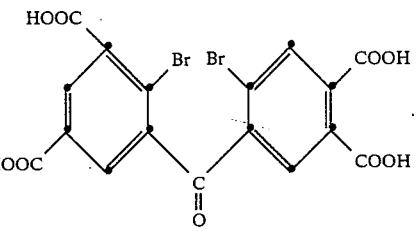

Reaction with Na$_2$S gives the thioxanthonetetracarboxylic acid, which can be oxidised in known manner to the sulfoxide or sulfone. Reaction with NaNH$_2$ or R$^b$NH$_2$ gives the acridonetetracarboxylic acid.

The preparation of polyamic acids from tetracarboxylic acids and diamines as intermediates for polyimides is generally known. The reaction is conveniently carried out in solution and the reaction temperatures may in the range from −20° to +300° C. The tert-ammonium salts are obtained by reacting the carboxyl groups of the polyamic acids with up to equimolar amounts of a tertiary amine.

The polyamic acid aryl esters can be obtained by reacting anhydrides to aryl esters, then chlorinating the carboxyl group and subsequently reacting it with a diamine. The partial alkylation with e.g. dimethyl sulfate gives mixtures of polyamic acid methyl esters. Other aliphatic groups can be introduced by transesterification with other alcohols.

The polyamic acids, aryl esters and tertiary ammonium salts can subsequently be isolated by conventional methods, e.g. by removing the solvent or by precipitation by adding a non-solvent. The solutions can also be used direct for coating substrates.

The polyamic acids, aryl esters and tert-ammonium salts are readily soluble in different solvents. They are most suitable for the preparation of films and protective coatings, which utility constitutes a further object of the invention.

To produce the coated material of this invention, the polymer or a mixture thereof is advantageously dissolved in a suitable organic solvent, with or without the application of heat. Examples of suitable solvents are polar, aprotic solvents which can be used by themselves or in mixtures of at least two solvents. Examples are: ethers such as dibutyl ether, tetrahydrofuran, dioxane, methylene glycol, dimethylethylene glycol, dimethyldiethylene glycoil, diethyldiethylene glycol and dimethyltriethylene glycol; halogenated hydrocarbons such as methylene chloride, chloroform, 1,2-dichloroethane, 1,1,1-trichloroethane and 1,1,2,2-tetrachloroethane; carboxylic acid esters and lactones such as ethyl acetate, methyl propionate, ethyl benzoate, 2-methoxyethyl acetate, $\gamma$-butyrolactone, o-valerolactone and pivalolactone; carboxamides and lactams such as formamide, acetamide, N-methylformamide, N,N-dimethylformamide, N,N-diethylformamide, N,N-dimethylacetamide, N,N-diethylacetamide, $\gamma$-butyrolactam, $\epsilon$-caprolactam, N-methylpyrrolidone, N-acetylpyrrolidone, N-methylcaprolactam, tetramethylurea and hexamethylphosphoric triamide; sulfoxides such as dimethylsulfoxide; sulfones such as dimethyl sulfone, diethyl sulfone, trimethylene sulfone and tetramethylene sulfone; trimethylamine, triethylamine, N-methylpyrrolidine, N-methylpiperidine, N-methylmorpholine and substituted benzenes such as chlorobenzene, nitrobenzene, phenols or cresol.

Undissolved constituents can be removed by filtration, preferably by pressure filtration. The concentration of polymer in the coating agent thus obtained is preferably not more than 50% by weight, in particular not more than 30% by weight and most preferably not more than 20% by weight, based on the solution.

Other customary modifiers which do not adversely affect the photosensitivity can be incorporated during the preparation of the solutions. Examples of such modifiers are delustering agents, flow control agents, finely particulate fillers, flameproofing agents, fluorescent whitening agents antioxidants, light stabilisers, stabilisers, dyes, pigments, adhesion promoters and the antihalo dyes disclosed e.g. in U.S. Pat. No. 4 349 619. If desired, sensitisers may also be incorporated in order to increase the photosensitivity.

The coating agent can be applied to suitable substrates by conventional methods such as immersion, brushing and spraying methods and whirl coating, cascade coating and curtain coating. Examples of suitable substrates are plastics, metals and metal alloys, semimetals, semiconductors, glass, ceramics and other inorganic materials, for example $SiO_2$ and $Si_3N_4$. After coating, the solvent is removed, if necessary by warming and if necessary in vacuo. Non-tacky, dry, uniform films are obtained. The films can have, coating thicknesses of up to about 500 $\mu$m or more, preferably of 0.5 to 500 $\mu$m and in particular of 1 to 50 $\mu$m, depending on their use.

It has been found that the polyamic acids, polyamic acid aryl esters and polyamic acid tert-ammonium salts are autophotocrosslinkable and can be crosslinked by applying irradiation. As the photosensitivity increases with an increasing number of such structural units, it is advantageous if the polymers contain at least 90 mol. % of structural units of formulae I and II.

Protective films can be prepared from the material of this invention by irradiation. Further, it is also possible to use the material as photographic recording material for relief images. Direct crosslinking by irradiation avoids the use of sensitisers and the images have excellent electrical properties. After irradiation, the polyamic acid, polyamic acid aryl ester or polyamic acid tert-ammonium salt can be converted into the corresponding polyimide by a heat treatment in the temperature range from 150° to 450° C., preferably from 200° to 400° C., thereby achieving the advantageous properties of polyimides. Such protective coatings and images are distinguished by their excellent heat stability. The layer thickness for photographic relief images is preferably 0.5 to 100 $\mu$m, in particular 1 to 50 $\mu$m and, most preferably, 1 to 10 $\mu$m.

The photostructuring or photocrosslinking can be effected by high-energy radiation, for example by light, in particular in the UV range, by X-rays, laser light, electron beams and the like. The material of this invention is admirably suitable for producing protective films and passivating lacquers and as a photographic recording material for heat-stable relief images.

Examples of fields of use are protective, insulating and passivating lacquers in electrotechnology and electronics, photomasks for electronics, textile printing and the graphics industry, etch resists for the production of printed circuits and printing plates and integrated circuits, relays for the production of X-ray masks, solder-stopping lacquers, dielectrics for multilayer circuits and structural elements for liquid crystal displays.

Protective films are produced by direct exposure, the exposure times essentially depending on the coating thicknesses and the photo-sensitivity. After irradiation, the polyimide can be obtained by a thermal aftertreatment.

Photographic production of the relief structure is effected by image-wise exposure through a photomask, and subsequent development with a solvent or a solvent mixture while removing the unexposed areas, after which the image produced may be stabilised by an optional thermal after-treatment to form the corresponding polyimide.

Such a process for producing protective layers and relief structures constitutes yet a further object of the invention. Suitable developers are e.g. the solvents indicated above.

The polymer layer of the material of this invention has a photosensitivity which is sufficient for many end uses and in some cases is high, and it can be photocrosslinked directly. The protective films and relief images especially those of polyimide coatings, are distinguished by good adhesion and by heat resistance, mechanical strength and resistance to chemicals. The material is storage stable but should be protected from the action of light.

The following Examples illustrate the invention in more detail.

A. PREPARATORY EXAMPLES

Example 1:

In a cylindrical reactor, 1.642 g (0.01 mole) of 3,6-diaminodurol are dissolved in 20 ml of N-methylpyrrolidone and, with stirring, 3.22 g (0.01 mole) of benzophenonetetracarboxylic dianhydride are added gradually in an inert gas atmosphere. After stirring for 4 hours, the polyamic acid solution is diluted with further N-methylpyrrolidone and the solution is further re-used direct.

Examples 2 to 6:

Different diamines are reacted with benzophenonetetracarboxylic anhydride in accordance with the procedure described in Example 1. To obtain tert-ammonium salts, 2 moles of the following amines, per mole of polyamic acid, are added to the polyamic acid solution of Example 5: trimethylamine (5a), ethyl diisopropylamine (5b), benzyldimethylamine (5c) and N-N-dimethylaniline (5d).

| Example | Diamine |
|---|---|
| 2 | 2,4-diamino-3,5-diethyltoluene |
| 3 | 3,3′,5,5′-tetramethyl-4,4′-diaminodiphenylmethane |
| 4 | 3,3′,5,5′-tetraethyl-4,4′-diaminodiphenylmethane |
| 5 | 3,3′-dimethyl-5,5′-diethyl-4,4′-diaminodiphenylmethane |
| 5a | trimethylammonium salt of the polyamic acid of Example 5 |
| 5b | ethyl diisopropylammonium salt of the polyamic acid of Example 5 |
| 5c | benzyldimethylammonium salt of the polyamic acid of Example 5 |
| 5d | dimethylphenylammonium salt of the polyamic acid of Example 5 |
| 6 | 3,3′,5,5′-tetramethyl-4,4′-diaminodiphenyl. |

Example 7:

Following the procedure of Example 1, a polyamic acid is prepared from stoichiometric amounts of 3,3′,5,5′-tetramethyl-4,4′-diaminodiphenylmethane and anthraquinone-2,3,6,7-tetracarboxylic dianhydride in N-methylpyrrolidone, except that the reaction time is extended to 20 hours.

B. USE EXAMPLES

A thin polymer film is produced on a copper-clad plastic plate by whirl-coating a 5% polymer solution thereon and subsequently removing the solvent in a circulating air oven. The solvent employed is N-methylpyrrolidone or dimethylformamide.

The coated plates are exposed through a photomask at room temperature with a 1000 watt UV lamp from a distance of 18 cm. The exposed plates are then developed with a solvent and the unexposed areas of the polymer film are dissolved out. The relief image is then made visible by etching away the exposed copper layer with FeCl₃ solution.

The exposure times for obtaining a complete image on the polymer films described in Examples 1–7 are:

| Example | 1 | 2 | 3 | 4 | 5 | 5a | 5b | 5c | 5d | 6 | 7 |
|---|---|---|---|---|---|---|---|---|---|---|---|
| seconds | 30 | 90 | 120 | 120 | 180 | 60 | 60 | 60 | 60 | 180 | 120 |

The polyamic acid images are cyclised to the corresponding polyimides by heating them to 300°–400° C.

What is claimed is:

1. A process for producing a protective coating which comprises
   (a) coating a substrate on at least one surface with a layer of a polyamic acid, which polymer contains 50 to 100 mol %, based on said polymer, of at least one structural unit of formula I or II

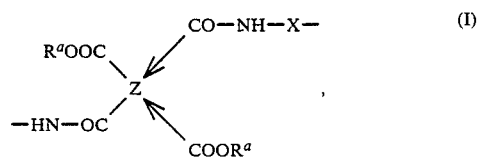

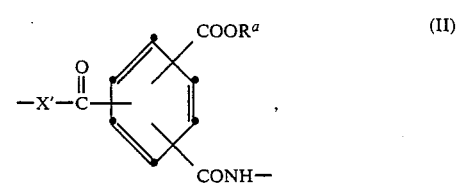

or of a mixture thereof, and 0 to 50 mol. % of a structural unit of formula III or IV

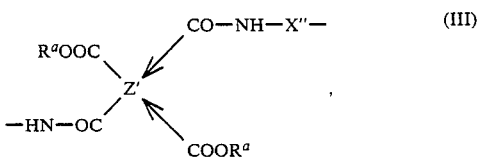

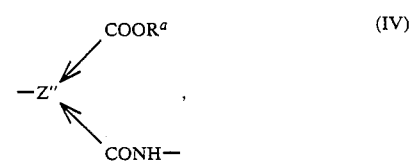

or of a mixture thereof, wherein the arrows denote position isomerism and

R$^a$ is a hydrogen atom,

Z is a tetravalent aromatic radical which contains a benzophenone structural unit and to which one —CONH and one —COOR$^a$ group is attached to one or two different phenyl radicals in ortho- or peri-position to each other, and where Z is a radical of formula V, VI, VII or XI

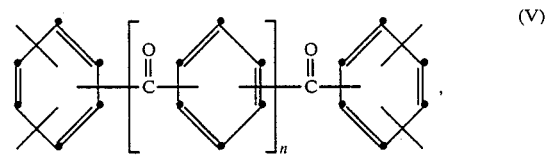

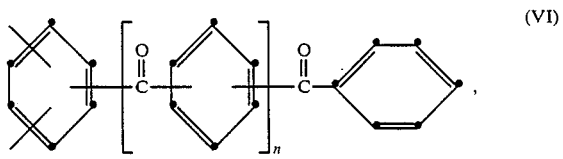

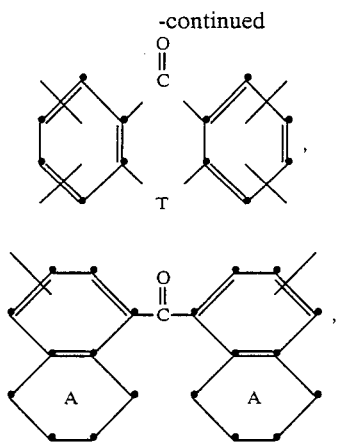

wherein n is 0 or 1, T is a direct bond, —CH₂—, —O—, —S—, —SO—, —SO₂—, —CO—, —NR$^b$— or —CR$^b$R$^c$—, wherein R$^b$ is a hydrogen atom, C₁–C₁₀alkyl, naphthyl or benzyl, and R$^c$ has the meaning of R$^b$ but is not hydrogen, the rings A in formula XI are saturated or aromatic, and a pair of free bonds is ortho to each other, Z' is a tetravalent aromatic radical which differs from Z and to which one ester group and one amide group are attached in ortho or peri-position to each other, Z" is a trivalent aromatic radical which differs from the radical in the structural unit of formula II and to which one ester and one amide group are attached in ortho- or peri-position to each other, X is the radical of an aromatic diamine which is substituted in both ortho-positions to at least one N-atom by alkyl, cycloalkyl, alkoxy, alkoxyalkyl or aralkyl, or two adjacent carbon atoms of the aromatic radical are substituted by alkylene, X' is a divalent aromatic radical which is substituted by at least one group as defined for X, and X" has the same meaning as X or is a divalent radical of an organic diamine which differs from the radical X, (b) irradiating the coated material to crosslink said material, and (c) heating the crosslinked layer to convert said layer to the corresponding polyimide form.

2. A process according to claim 1 where in the polymer the aromatic radicals X and X' are each a divalent, mononuclear or binuclear phenylene radical.

3. A process according to claim 1 where in the polymer an alkyl or alkoxy substituent of X and X' contains 1 to 20 carbon atoms, an alkoxy-alkyl substituent of X and X' contains 2 to 12 carbon atoms, a cycloalkyl substituent of X and X' contains 5 or 6 ring carbon atoms, an alkylene substituent of X and X' contains 3 or 4 carbon atoms, and an aralkyl substituent is benzyl.

4. A process according to claim 3 wherein the substituent of X and X' is alkyl of 1 to 4 carbon atoms.

5. A process according to claim 1 where in the polymer the aromatic radicals Z and Z' contain 6 to 30 carbon atoms.

6. A process according to claim 1 where in the polymer n in formulae V and VI is 0 and T in formula VII is —O— or —CO—.

7. A process according to claim 1 where in the polymer Z' is selected from the group consisting of

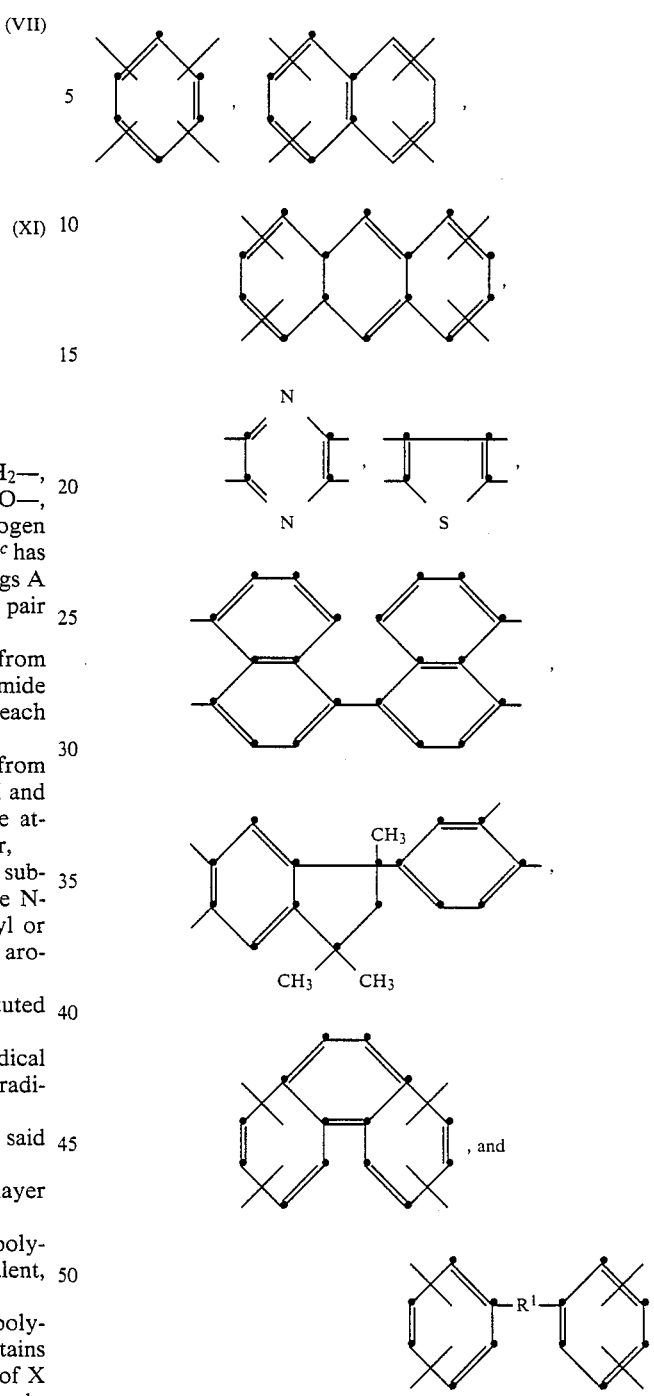

wherein R¹ is a direct bond or a bridge of the formula

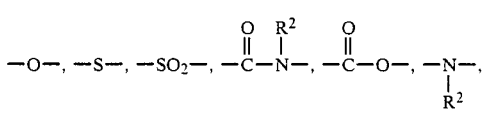

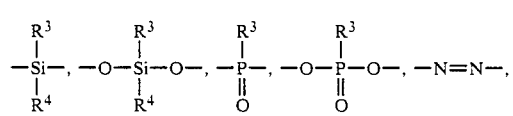

-continued

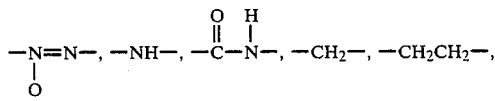

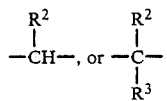

wherein $R^2$, $R^3$ and $R^4$ are $C_1$-$C_6$alkyl, phenyl or benzyl, and $R^3$ and $R^4$ in the silicone-containing groups are $C_1$-$C_6$alkoxy, phenoxy or benzyloxy.

8. A process according to claim 7 where in the polymer Z' is a radical of the formula

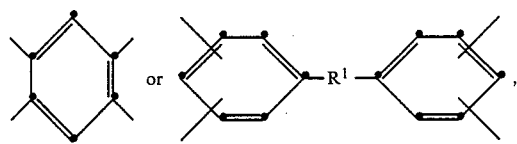

wherein $R^1$ is a direct bond, —O—, —SO$_2$— or —CH$_2$—.

9. A process according to claim 1 where in the polymer Z'' in formula IV is a radical of the formula

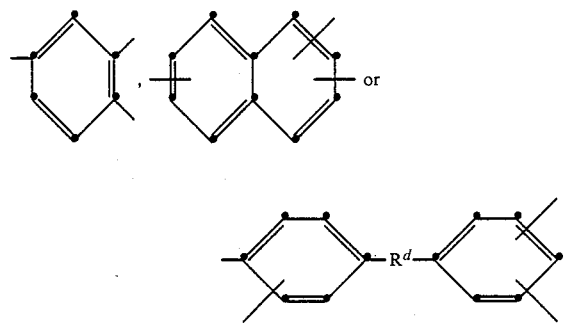

wherein $R^d$ is a bridge or a direct bond.

10. A process according to claim 1 where in the polymer an aromatic radical X is a radical of formula VIII, VIIIa and/or VIIIb

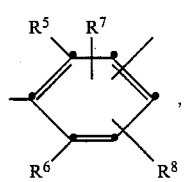
(VIII)

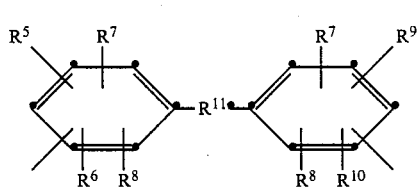
(VIIIa)

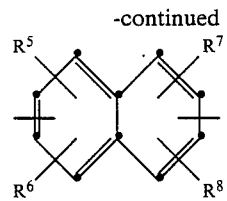
(VIIIb)

wherein the free bonds in formula VIII are meta or para to each other and in formula VIIIa are meta or para to the $R^{11}$ group and $R^5$ and $R^6$ are located in both ortho-positions to the free bond, and in formula VIIIb the free bonds are in 2-, 3-, 6- and 7-position and $R^5$ and $R^6$ are located in both ortho-positions to the free bonds; $R^{11}$ is a direct bond, —O—, —S—, —SS—, —SO—, —SO$_2$—, —CO—, —COO—, —NH—, —N—alkyl containing 1 to 6 carbon atoms in the alkyl moiety, —N—phenyl, —N—benzyl, —CONH—, —CON—alkyl— containing 1 to 6 carbon atoms in the alkyl moiety, —CON—phenyl—, —CON—benzyl—,

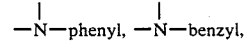

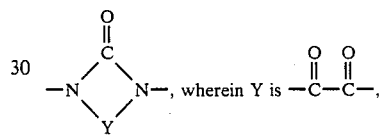

and $R^{17}$ is a hydrogen atom, $C_1$-$C_6$alkyl or phenyl, linear or branched alkylene of 1 to 3 carbon atoms, alkylidene of 2 to 12 carbon atoms which is unsubstituted or substituted by chloro or fluoro, cycloalkylidene containing 5 or 6 ring atoms, phenylene, phenylenedioxy, or the

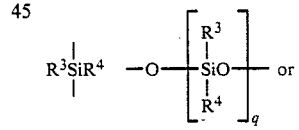

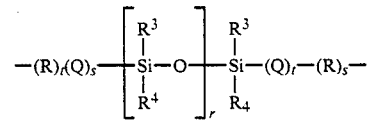

group, wherein $R^3$ and $R^4$ are alkyl or alkoxy, each of 1 to 6 carbon atoms, phenyl, benzyl, phenoxy or benzyloxy, r is an integer from 1 to 10, t is 0 or 1 and s is 0 or 1, R is —O— or —S— and Q is $C_1$-$C_6$alkylene, q is an integer from 1 to 100, $R^5$ and $R^6$ are alkyl or alkoxy, each of 1 to 12 carbon atoms, alkoxyalkyl of 2 to 12 carbon atoms, cyclopentyl, cyclohexyl or benzyl, or $R^5$ and $R^7$ in formula VIII or VIIIa are adjacent to each other and, when taken together, are trimethylene or tetramethylene, or $R^6$ is also a hydrogen atom, $R^7$ and $R^8$ are hydrogen or independently have the meaning of $R^5$ and $R^7$, and $R^9$ and $R^{10}$ are hydrogen or independently have the meaning of $R^5$ and $R^6$, or $R^7$ and $R^9$ in formula VIIIa, when taken together, are trimethylene or tetramethylene.

11. A process according to claim 10 wherein $R^5$ and $R^6$ are $C_1$-$C_6$-alkyl.

12. A process according to claim 10 wherein $R^{11}$ is —$CH_2$—, —O—, —CO— or a direct bond.

13. A process according to claim 10 wherein the free bonds in formula VIIIa are para to the $R^{11}$ group.

14. A process according to claim 1 wherein the polyamic acid as a copolymer contains at least 2 different structural units.

15. A process according to claim 14 wherein the structural units of formula I in the radical X are different.

16. A process according to claim 10 wherein X is a radical of formula

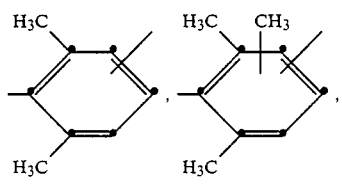

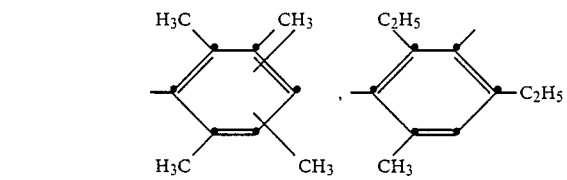

wherein the free bonds are meta or para to each other; or is a radical of formula

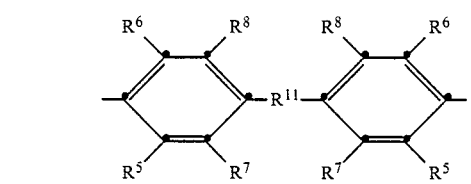

wherein $R^5$ and $R^6$ are each independently methyl, ethyl, n-propyl or isopropyl, and $R^7$ and $R^8$ are a hydrogen atom or have the meaning of $R^5$, or $R^5$ and $R^7$, when taken together, are trimethylene or tetramethylene and $R^6$ and $R^7$ are a hydrogen atom, and $R^{11}$ is a direct bond, —$CH_2$— or —CO—.

17. A process according to claim 16 wherein the polyamic acid is a copolymer in which X corresponds to two or more radicals of the formulae

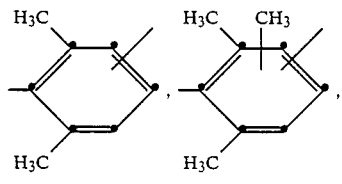

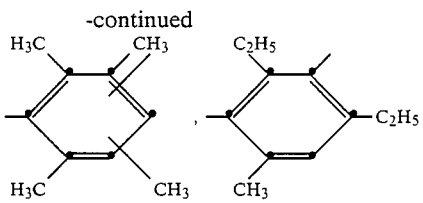

wherein the free bonds are meta or para to each other, or of the formula

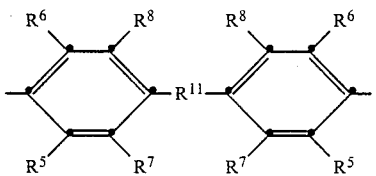

wherein $R^5$, $R^6$, $R^7$, $R^8$ and $R^{11}$ are defined in claim 16.

18. A process according to claim 1 where in the polymer X" in formula III is $C_2$-$C_{30}$-alkylene, cycloalkylene containing 5 or 6 ring carbon atoms, $C_7$-$C_{30}$-aralkylene, $C_6$-$C_{22}$-arylene or a polysiloxane radical.

19. A process according to claim 18 wherein X" as arylene has the formula

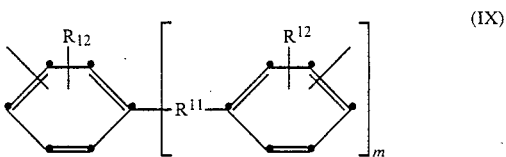

(IX)

wherein m is 0 or 1, the free bonds are meta or preferably ortho to the $R^{12}$ group, $R^{11}$ has the same meaning as in formula VIIIa and $R^{12}$ has the same meaning as $R^5$.

20. A process according to claim 19 wherein X" corresponds to formula IX, IXb or IXc

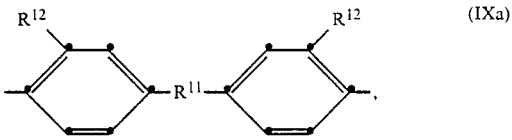

(IXa)

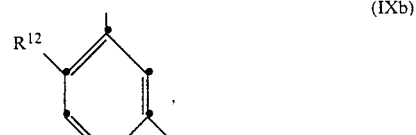

(IXb)

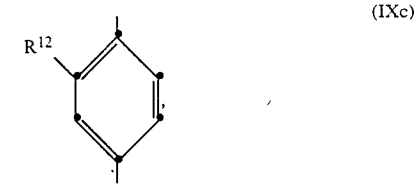

(IXc)

wherein $R^{11}$ is a direct bond, —O—, —CO— or —$CH_2$—, and $R^{12}$ is methyl, ethyl, isopropyl, methoxy, ethoxy or a hydrogen atom.

21. A process according to claim 1 wherein the polymer contains 80-100 mol % of structural units of formula I, formula II or mixtures thereof, and 20-0 mol % of structural units of formula III, formula IV or mixtures thereof.

22. A process according to claim 1 where in the polymer the aromatic radical X' is an alkyl-substituted phenylene radical or bisphenylene radical.

23. A process according to claim 22 wherein the radical X' is of formula X

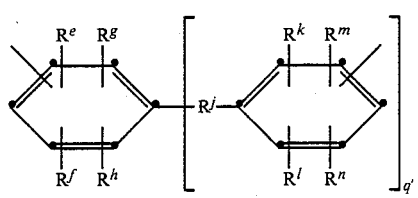
(X)

wherein q' is 0 or 1, R$^j$ is a direct bond or a bridge, R$^1$ is C$_1$-C$_4$alkyl and R$^g$ to R$^n$ is a hydrogen atom or C$_1$-C$_4$alkyl, and the free bonds are meta or para to the R$^j$ group.

24. A process according to claim 23 wherein R$^j$ is a direct bond, or a bridge selected from the group consisting of —S—, —SO—, —SO$_2$, —CO—, —CH$_2$—, —O— or C$_2$-C$_6$-alkylidene.

25. A process according to claim 1 where in the polymer the radical of formula II corresponds to the structural unit

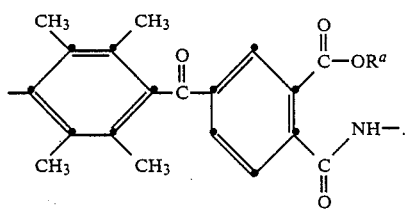

26. A process for producing a relief image which comprises
(a) coating a substrate with a layer of a polyamic acid, which polymer contains 50 to 100 mol %, based on said polymer, of at least one structural unit of formula I or II

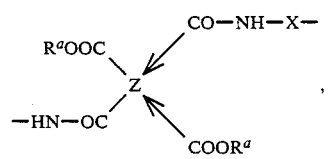
(I)

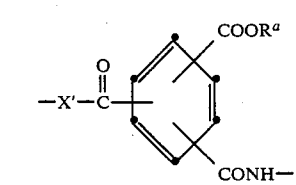
(II)

or of a mixture thereof, and 0 to 50 mol. % of a structural unit of formula III or IV

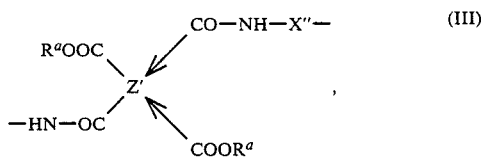
(III)

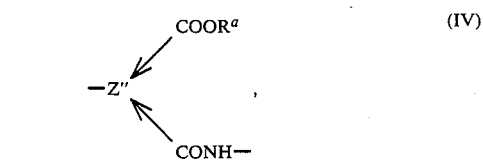
(IV)

or of a mixture thereof, wherein the arrows denote position isomerism and

R$^a$ is a hydrogen atom,

Z is a tetravalent aromatic radical which contains a benzophenone structural unit and to which one —CONH and one —COOR$^a$ group is attached to one or two different phenyl radicals in ortho- or peri-position to each other, and where Z is a radical of formula V, VI, VII or XI

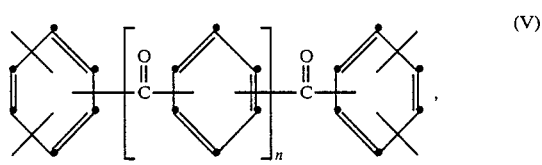
(V)

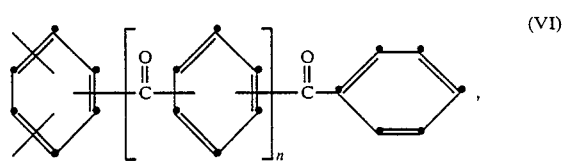
(VI)

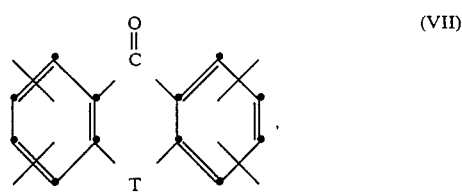
(VII)

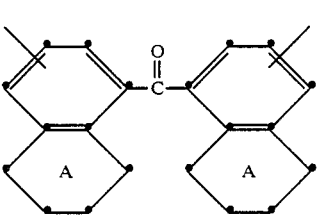
(XI)

wherein n is 0 or 1, T is a direct bond, —CH$_2$—, —O—, —S—, —SO—, —SO$_2$—, —CO—, —NR$^b$— or —CR$^b$R$^c$—, wherein R$^b$ is a hydrogen atom, C$_1$-C$_{10}$alkyl, naphthyl or benzyl, and Rc has the meaning of R$^b$ but is not hydrogen, the rings A in formula XI are saturated or aromatic, and a pair of free bonds is ortho to each other, Z' is a tetravalent aromatic radical which differs from Z and to which one ester group and one amide group are attached in ortho- or peri-position to each other, Z' is a trivalent aromatic radical which differs from the radical in the structural unit of formula II and to which one ester and one amide group are attached in ortho- or peri-position to each other, X is the radical of an aromatic diamine which is substituted in both ortho-positions to at least one N-atom by alkyl, cycloalkyl, alkoxy, alkoxyalkyl or aralkyl, or two adjacent carbon atoms of the aromatic radical are substituted by alkylene, X' is a divalent aromatic radical which is substituted by at least one group as defined for X, and X" has the same meaning as X or is a divalent radical of an organic diamine which differs from the radical X, (b) irradiating the coated material through a photomask, (c) developing the image by treating the material with a solvent to remove the uncrosslinked polymer from the areas not exposed to irradiation, and (d) heating the crosslinked image to convert said image to the corresponding polyimide form.

27. A process according to claim 26 where in the polymer the aromatic radicals X and X' are each a divalent, mononuclear or binuclear phenylene radical.

28. A process according to claim 26 where in the polymer an alkyl or alkoxy substituent of X and X' contains 1 to 20 carbon atoms, an alkoxy-alkyl substituent of X and X' contains 2 to 12 carbon atoms, a cycloalkyl substituent of X and X' contains 5 or 6 ring carbon atoms, an alkylene substituent of X and X' contains 3 or 4 carbon atoms, and an aralkyl substituent is benzyl.

29. A process according to claim 28 wherein the substituent of X and X' is alkyl of 1 to 4 carbon atoms.

30. A process according to claim 26 where in the polymer the aromatic radicals Z and Z' contain 6 to 30 carbon atoms.

31. A process according to claim 26 where in the polymer n in formulae V and VI is 0 and T in formula VII is —O— or —CO—.

32. A process according to claim 26 where in the polymer Z' is selected from the group consisting of

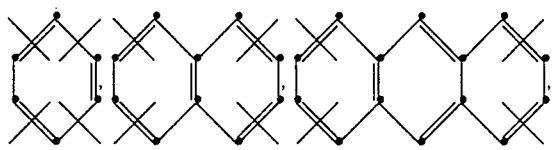

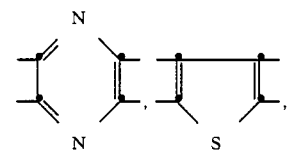

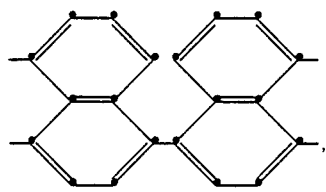

-continued

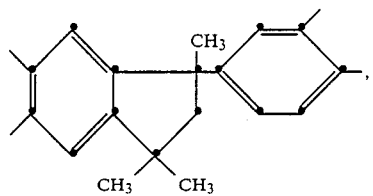

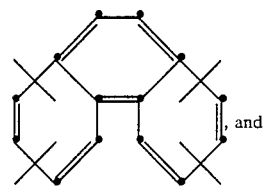

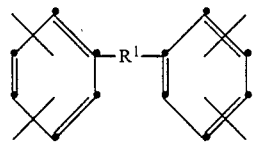

wherein $R^1$ is a direct bond or a bridge of the formula

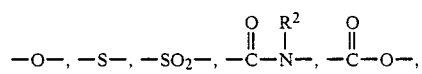

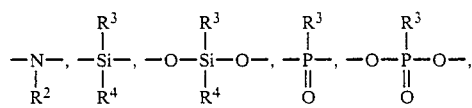

$$-N=N-, \; -N=N-, \; -NH-, \; -\overset{O}{\underset{\parallel}{C}}-\overset{H}{\underset{\mid}{N}}-, \; -CH_2-,$$
$$\phantom{xxxxxx}\overset{\mid}{\underset{O}{}}$$

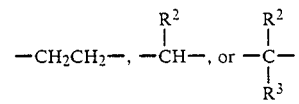

wherein $R^2$, $R^3$ and $R^4$ are $C_1$-$C_6$alkyl, phenyl or benzyl, and $R^3$ and $R^4$ in the silicone-containing groups are $C_1$-$C_6$alkoxy, phenoxy or benzyloxy.

33. A process according to claim 32 wherein Z' is a radical of the formula

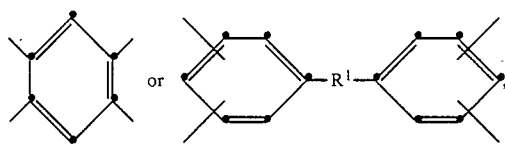

wherein $R^1$ is a direct bond, —O—, —SO$_2$— or —CH$_2$—.

34. A process according to claim 26 where in the polymer Z" in formula IV is a radical of the formula

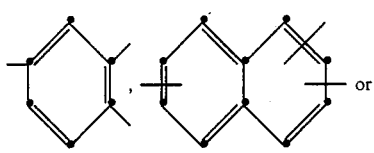

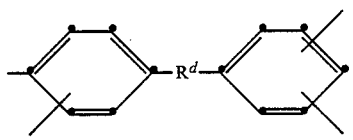

wherein $R^d$ is a bridge or a direct bond.

35. A process according to claim 26 where in the polymer an aromatic radical X is a radical of formula VIII, VIIIa and/or VIIIb

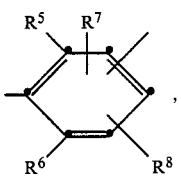 (VIII)

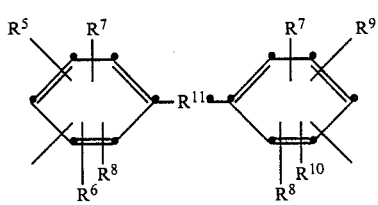 (VIIIa)

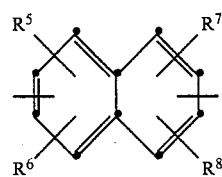 (VIIIb)

wherein the free bonds in formula VIII are meta or para to each other and in formula VIIIa are meta or para to the $R^{11}$ group and $R^5$ and $R^6$ are located in both ortho-positions to the free bond, and in formula VIIIb the free bonds are in 2-, 3-, 6- and 7-position and $R^5$ and $R^6$ are located in both ortho-positions to the free bonds; $R^{11}$ is a direct bond, —O—, —S—, —SS—, —SO—, —SO$_2$—, —CO—, —COO—, —NH—, —N—alkyl containing 1 to 6 carbon atoms in the alkyl moiety,

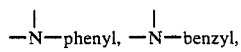

—CONH—, —CON—alkyl— containing 1 to 6 carbon atoms in the alkyl moiety, —CON—phenyl—, —CON—benzyl—,

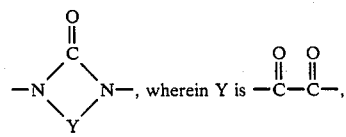

-continued

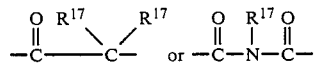

and $R^{17}$ is a hydrogen atom, $C_1$-$C_6$alkyl or phenyl, linear or branched alkylene of 1 to 3 carbon atoms, alkylidene of 2 to 12 carbon atoms which is unsubstituted or substituted by chloro or fluoro, cycloalkylidene containing 5 or 6 ring atoms, phenylene, phenylenedioxy, or the

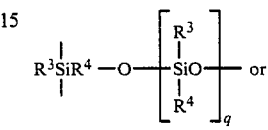

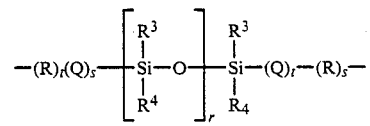

group, wherein $R^3$ and $R^4$ are alkyl or alkoxy, each of 1 to 6 carbon atoms, phenyl, benzyl, phenoxy or benzyloxy, r is an integer from 1 to 10, t is 0 or 1 and s is 0 or 1, R is —O— or —S— and Q is $C_1$-$C_6$alkylene, q is an integer from 1 to 100, $R^5$ and $R^6$ are alkyl or alkoxy, each of 1 to 12 carbon atoms, alkoxyalkyl of 2 to 12 carbon atoms, cyclopentyl, cyclohexyl or benzyl, or $R^5$ and $R^7$ in formula VIII or VIIIa are adjacent to each other and, when taken together, are trimethylene or tetramethylene, or $R^6$ is also a hydrogen atom, $R^7$ and $R^8$ are hydrogen or independently have the meaning of $R^5$ and $R^7$, and $R^9$ and $R^{10}$ are hydrogen or independently have the meaning of $R^5$ and $R^6$, or $R^7$ and $R^9$ in formula VIIIa, when taken together, are trimethylene or tetramethylene.

36. A process according to claim 35 wherein $R^5$ and $R^6$ are $C_1$-$C_6$-alkyl.

37. A process according to claim 35 wherein $R^{11}$ is —CH$_2$—, —O—, —CO— or a direct bond.

38. A process according to claim 35 wherein the free bonds in formula VIIIa are para to the $R^{11}$ group.

39. A process according to claim 26 wherein the polyamic acid as a copolymer contains at least 2 different structural units.

40. A process according to claim 39 wherein the structural units of formula I in the radical X are different.

41. A process according to claim 35 wherein X is a radical of formula

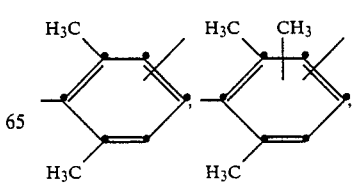

-continued

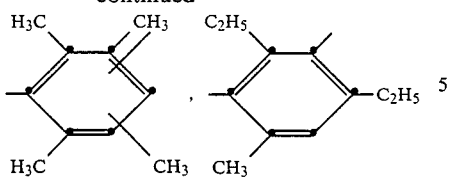

wherein the free bonds are meta or para to each other; or is a radical of formula

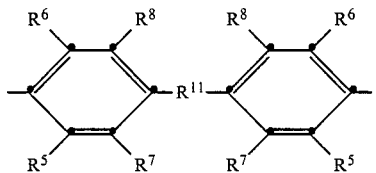

wherein $R^5$ and $R^6$ are each independently methyl, ethyl, n-propyl or isopropyl, and $R^7$ and $R^8$ are a hydrogen atom or have the meaning of $R^5$, or $R^5$ and $R^7$, when taken together, are trimethylene or tetramethylene and $R^6$ and $R^7$ are a hydrogen atom, and $R^{11}$ is a direct bond, —CH$_2$— or —CO—.

42. A process according to claim 41 wherein the polyamic acid is a copolymer in which X corresponds to two or more radicals of the formulae

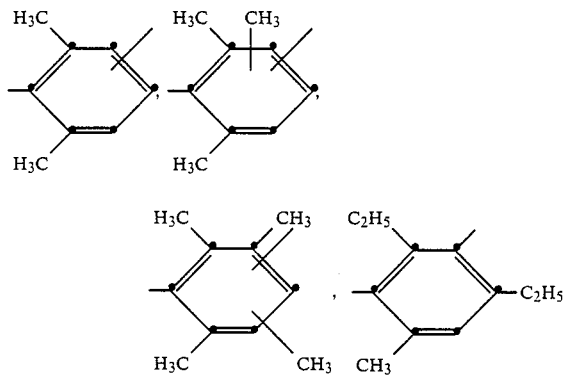

wherein the free bonds are meta or para to each other, or of the formula

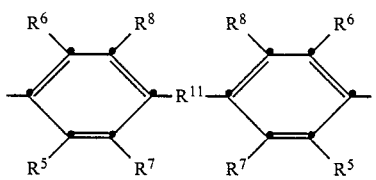

wherein $R^5$, $R^6$, $R^7$, $R^8$ and $R^{11}$ are defined in claim 41.

43. A process according to claim 26 where in the polymer X" in formula III is $C_2$-$C_{30}$-alkylene, cycloalkylene containing 5 or 6 ring carbon atoms, $C_7$-$C_{30}$-aralkylene, $C_6$-$C_{22}$-arylene or a polysiloxane radical.

44. A process according to claim 43 wherein X" as arylene has the formula

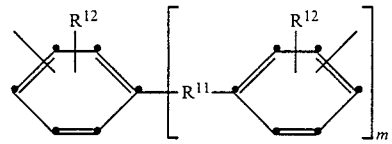

wherein m is 0 or 1, the free bonds are meta or preferably ortho to the $R^{12}$ group, $R^{11}$ has the same meaning as in formula VIIIa and $R^{12}$ has the same meaning as $R^5$.

45. A process according to claim 44 wherein X" corresponds to formula IX, IXb or IXc

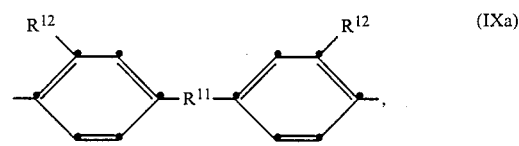

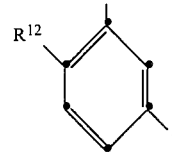

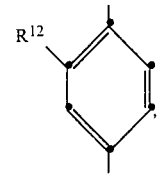

wherein $R^{11}$ is a direct bond, —O—, —CO— or —CH$_2$—, and $R^{12}$ is methyl, ethyl, isopropyl, methoxy, ethoxy or a hydrogen atom.

46. A process according to claim 26 wherein the polymer contains 80–100 mol % of structural units of formula I, formula II or mixtures thereof, and 20–0 mol % of structural units of formula III, formula IV or mixtures thereof.

47. A process according to claim 26 where in the polymer the aromatic radical X' is an alkyl-substituted phenylene radical or bisphenylene radical.

48. A process according to claim 47 wherein the radical X' is of formula X

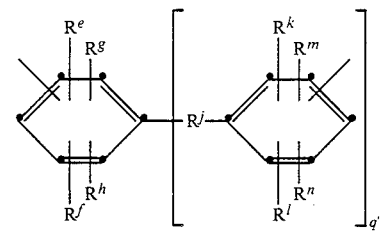

wherein q' is 0 or 1, $R^j$ is a direct bond or a bridge, $R^1$ is $C_1$-$C_4$alkyl and $R^g$ to $R^n$ is a hydrogen atom or $C_1$-$C_4$alkyl, and the free bonds are meta or para to the $R^j$ group.

49. A process according to claim 48 wherein $R^j$ is a direct bond, or a bridge selected from the group consisting of —S—, —SO, —SO$_2$, —CO—, —CH$_2$—, —O— or C$_2$–C$_6$-alkylidene.
50. A process according to claim 26 where in the polymer the radical of formula II corresponds to the structural unit
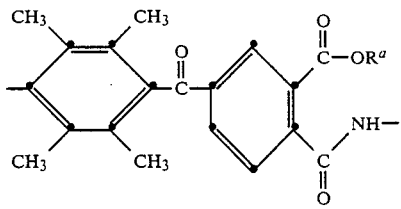
* * * * *